United States Patent [19]

Latos

[11] Patent Number: 5,014,179

[45] Date of Patent: May 7, 1991

[54] TRANSISTOR LOAD-LINE CONTROLLER

[75] Inventor: Thomas S. Latos, Huntley, Ill.

[73] Assignee: Sundstrand Corporation, Rockford, Ill.

[21] Appl. No.: 419,947

[22] Filed: Oct. 11, 1989

[51] Int. Cl.⁵ .......................................... H02M 3/335
[52] U.S. Cl. ...................................... 363/56; 363/37; 363/98; 363/132
[58] Field of Search .................. 363/37, 55, 56, 97, 363/98, 131, 132

[56] References Cited

U.S. PATENT DOCUMENTS

| | | | |
|---|---|---|---|
| 4,415,960 | 11/1983 | Clark, Jr. | 363/56 |
| 4,427,902 | 1/1984 | Hickman et al. | 363/56 |
| 4,620,272 | 10/1986 | Fulton et al. | 363/37 |
| 4,672,524 | 6/1987 | Toriyama et al. | 363/56 |
| 4,680,664 | 7/1987 | Leuthen | 363/56 |
| 4,783,714 | 11/1988 | Kalina | 363/56 |
| 4,792,885 | 12/1988 | Cuman et al. | 363/56 |

Primary Examiner—Peter S. Wong
Attorney, Agent, or Firm—Antonelli, Terry, Stout & Kraus

[57] ABSTRACT

A transistor circuit (50) in accordance with the invention includes a bipolar transistor (52) having a base and an emitter and collector coupled to a source of variable DC potential (54); an electrical load (22) coupled between the source of variable DC potential and one of the emitter and collector; a limit current generator (60), responsive to the variable DC potential, for producing a signal specifying a current limit for operating the transistor as a function of the sensed potential; a current sensor (64), coupled to the transistor circuit, for sensing current flow to the load from the source of DC potential; and a comparator (62), responsive to the current limit and the current flow to the load, for providing on an output a turnoff signal to the base of the transistor when the current flow exceeds the current limit.

12 Claims, 3 Drawing Sheets

TRANSISTOR LOAD-LINE CONTROLLER

TECHNICAL FIELD

The present invention relates to control of peak current through transistors which are used for high power switching applications.

BACKGROUND ART

A VSCF system generates polyphase alternating current of variable frequency by means of a polyphase alternator driven at a speed varying power takeoff to an airframe propulsion engine. The resultant variable frequency alternating current is rectified by a rectification bridge to produce D.C. An inverter comprised of three pairs of power transistors has each transistor of each pair of transistors associated with each phase switched alternately on and off at the desired output frequency of the alternating current to be generated to produce three square waves of voltage at the fundamental frequency displaced 120° apart. The three square waves are filtered to produce low distortion three phase alternating current at 400 Hz for driving loads on airframes. Pulse width modulation schemes can be employed to minimize the size of the output filter.

Specifications for electrical power generating systems in airframes are specified in terms of a normal generating capacity and an overload capacity such as 75/90 KVA. The power generating system must be able to withstand generating three times the normal maximum specification which in the above example is 225 KVA for 5 seconds. This rating specification is provided in order for load protected devices to have time to activate fault protection circuits contained therein. The tripled power specification provides the necessary electrical load until the foregoing fault circuits may be tripped in the electrical loads.

In VSCF systems utilizing inverters, a snubbing circuit 10, as illustrated in FIG. 1, has been used to protect a bipolar power transistor 12 against damage caused by switching inductive loads. The snubbing circuit 10 is comprised of a diode 16 and a series capacitor 18 and a resistor 20 connected in parallel to the diode. The output voltage $V_{out}$ is applied to a filter which removes harmonics prior to application to a load (not illustrated). The purpose of the snubbing circuit 10 is to prevent operation on a load line during turnoff which when switching off peak current values flowing in an inverter electrical load would damage the power transistor as described below with reference to FIG. 2. The snubbing circuit 10 functions to limit the collector-to-emitter voltage across the transistor 12 during the switching instant to a level which prevents damage to the transistor by reducing the power dissipation which is the product of the transition voltage and transistor current. The transistor current is determined by the three times normal power specification described above. As a result, the capacitance 18 must be sized to handle the three times power specification with the attendant weight penalty which in airframes is of extreme importance in the overall operational efficiency of the aircraft. The capacitance 18 dissipates energy equal to $\frac{1}{2}CV^2f$ where C is the capacitance and the V is the voltage dropped across the capacitor and f is the switching frequency. The resistance 20 determines the rate of discharge of charge on the capacitance 18 stored during turnoff of the transistor 12. In VSCF systems the snubbing circuits 10 often must be designed to dissipate more than a kilowatt of energy. These circuits may contribute several pounds to the system's weight. The elimination of the snubbing circuit in switches of an inverter in an airframe power supply which switches high current values would increase the overall operational efficiency of the aircraft.

FIG. 2 illustrates a reverse bias safe operating area characteristic of a power transistor such as transistor 12 of FIG. 1 with the dotted line representing a Motorola MJ 13080 power transistor and the solid line representing a Motorola MJ 13081 power transistor. For inductive loads, high voltage and high current occur simultaneously across the transistor during turnoff with the base to emitter junction being reverse biased. It is necessary for the collector-to-emitter voltage to be held in the area of the graph of FIG. 2 to the left of the curved dotted and solid lines respectively for the MJ 13080 and MJ 13081 transistors in order to sustain safe operating conditions for the power transistor without damage. Operation to the right of the lines will cause damage to the power transistor. In a VSCF system the function of the snubbing circuit is to maintain the operating voltage across the transistor within the safe area to the left of the curves with the disadvantage of the snubbing circuit being the weight penalty which it represents and the energy it dissipates.

FIG. 3 illustrates a prior art current limit controller 30 which is used in applications such as motor drives, DC to DC converters or in voltage regulators. The current limit controller 30 functions to control the conductivity of a switch 30, which may be a power transistor such as transistor 12 as discussed above with reference to the prior art of FIG. 1, against switching currents exceeding a current limit $I_L$ described below. A current sensor 32 senses the current I flowing through load 34 when switch 30 is closed. The sensed current is compared to the current $I_L$ by a comparator 36 which produces a low output signal when the sensed current I is greater than the limiting current $I_L$. The output signal from the comparator 36 is applied to a first input to AND gate 38. A control input is applied to the second input of AND gate 38 to control the conductivity of the switch 30 for the desired application such as a square-wave for a motor drive. Depending upon the application, the limit $I_L$ may be either fixed, such as applications for motor drives and DC to DC converters, or programmable to be proportional to an error voltage when used in applications such as a voltage regulator. The system of FIG. 3 is not responsive to a current limit which varies as a function of a DC potential being switched by the switch 30 and further is not known to generate the current limit as a function of the characteristic of FIG. 2 as described above.

DISCLOSURE OF THE INVENTION

A transistor circuit in accordance with the present invention includes a bipolar transistor having a base and an emitter and collector coupled to a source of variable DC potential; an electrical load coupled between the source of variable DC potential and one of the emitter and collector; a voltage sensor, coupled to the source of DC potential, for sensing the potential of the source of DC potential; a current limit generating circuit, responsive to the sensed potential, for producing a signal specifying a current limit for operating the transistor as a function of the sensed potential; a current sensor, coupled to the transistor circuit, for sensing current flow to the load from the source of DC potential; and a comparator, responsive to the current limit and the current flow to the load for providing on an output a turn off signal to the base of the transistor when the current flow exceeds the current limit. The invention further includes a switching control signal source providing a switching signal to the base of the transistor for controlling conduction of the transistor, the turn off signal being generated in response to the transistor switching signal and the current flow to the load exceeding the limit. A base control gate is provided having an output coupled to the base of the transistor and a pair of inputs respectively coupled to the output of the comparator and the switching signal, the gate providing a signal turning on the transistor in response to the switching signal having a first predetermined level and a signal turning off the transistor in response to either the turn off signal or the switching signal having a second level. The gate is an AND gate. The current limit is a maximum collector current as a function of collector to emitter voltage during turn off which the transistor may switch without damage. The source of variable DC potential comprises a rectification bridge and a propulsion engine mounted voltage controlled generator in a variable speed constant frequency power generating system in an airframe and the transistor switch is within an inverter contained in the power generating system. Furthermore, a snubbing circuit may be coupled to the emitter and collector of the transistor, the snubbing circuit containing a capacitor; and wherein the current limit is a maximum collector current as a function of collector to emitter voltage during turn off which the transistor may switch without damage and the capacitance of the capacitor is a function of an amount peak current which the transistor load may draw exceeds the maximum switchable collector current.

BEST MODE FOR CARRYING OUT THE INVENTION

Figure 1:
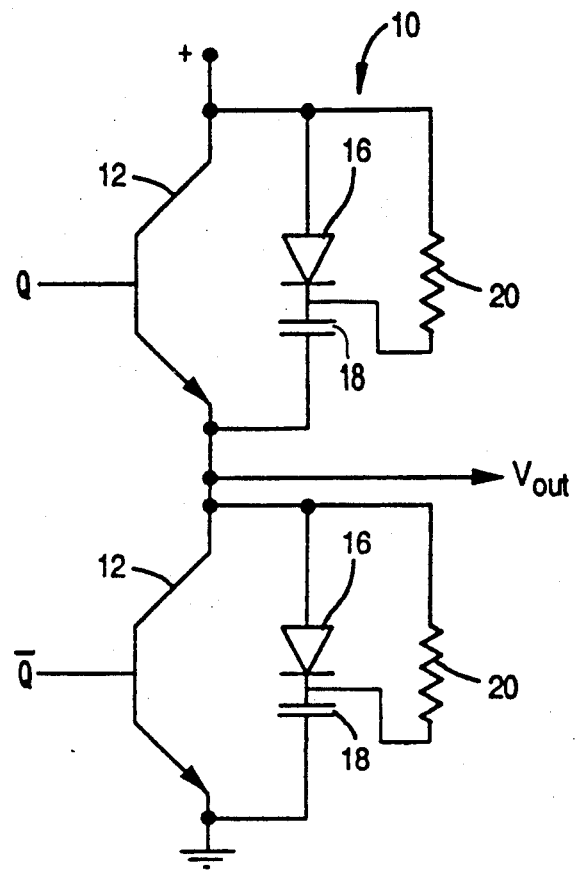
FIG. 1 illustrates a prior art snubbing circuit.
Figure 3:
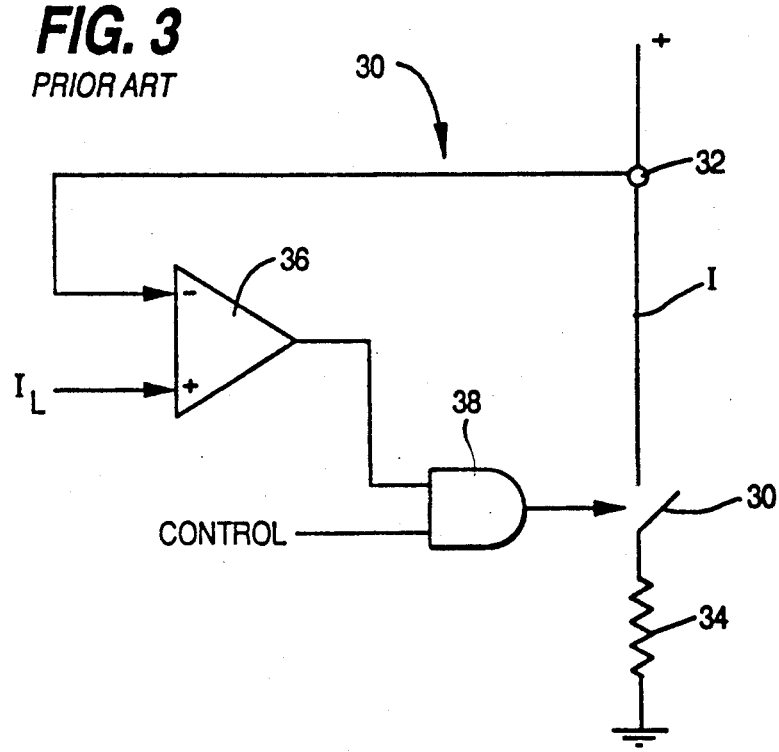
FIG. 3 illustrates a current limit controller in accordance with the prior art.
Figure 2:
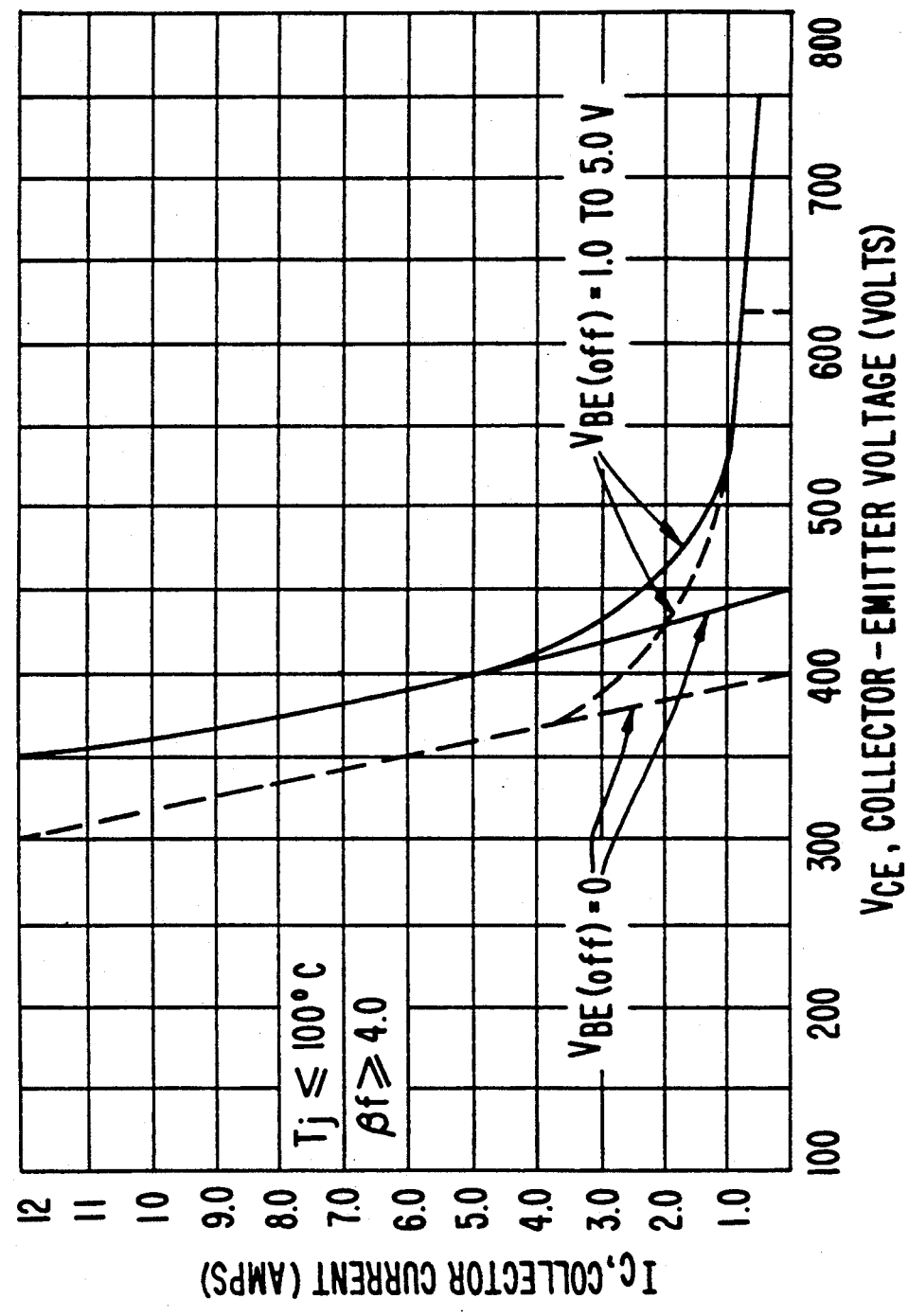
FIG. 2 illustrates a reverse bias safe operating area of a bipolar power transistor in accordance with the prior art.
Figure 4:
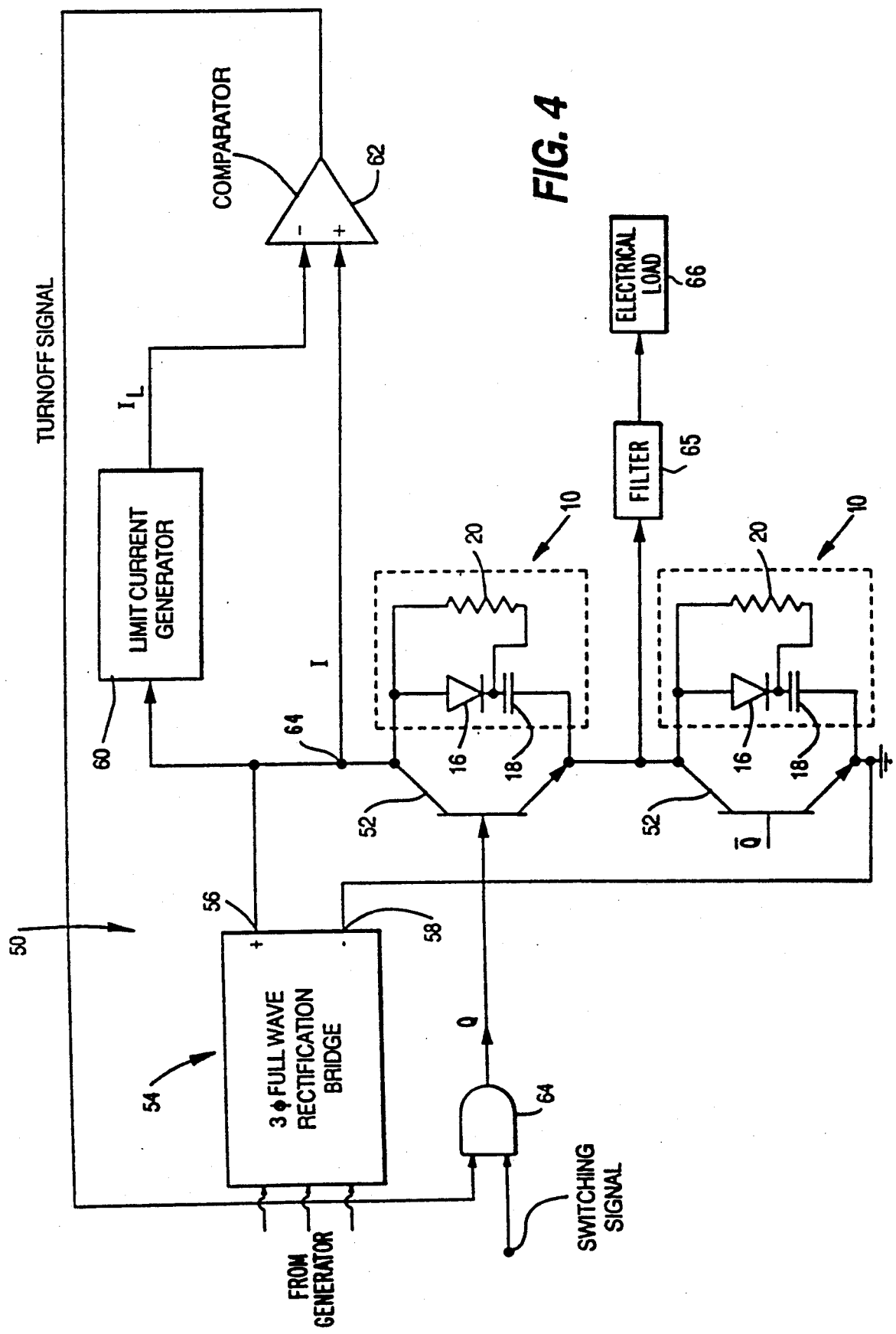
FIG. 4 illustrates a block diagram of a transistor circuit in accordance with the present invention.

FIG. 4 illustrates a block diagram of a transistor circuit in accordance with the present invention. The transistor circuit 50, while not limited thereto, is preferably for application in an inverter of a VSCF power generating system in an airframe. With the invention, the snubbing circuit 10 of the prior art may be eliminated which lightens the overall weight of the inverter in the VSCF system which is an important consideration in the overall operating efficiency of an airframe containing VSCF power generating systems. The invention functions to maintain the operation of a power bipolar transistor 52 in the reverse bias safe operating area of the prior art of FIG. 2 without the snubbing circuit 10 of FIG. 1. Optionally, as indicated by the dotted line box, the snubbing circuit 10 may be included with the inverter with the size of the components within the snubbing circuit 10 being downsized as a function of an amount peak collector current which the electrical load 66 may draw that exceeds the maximum collector current within the safe operating area of the characteristic of FIG. 2 described above. A smaller capacitor may be used in view of the energy absorbing characteristic being reduced by the present invention. Similarly, the size of the resistance necessary to dissipate the energy stored in the capacitor may be reduced. A three phase fullwave rectification bridge 54 provides output DC on terminals 56 and 58 which varies in magnitude as a function of the AC load 66 (not illustrated) attached to the output between the power transistor 52. A filter 65 removes harmonics to produce a pure AC output waveform applied to the AC load 66. It should be understood that the pair of transistors 52 would be one of a group of at least three pairs of power transistors if the invention is used in an inverter of a VSCF system. The complete inverter circuitry is well known and has not been illustrated for purposes of simplifying the illustration of the invention. Variation in the output potential of the three phase fullwave rectification bridge 54 causes the maximum collector current load line to vary in the characteristic of the prior art discussed above with reference to FIG. 2. A current limit generator 60 produces an output limit $I_L$ in accordance with the prior art characteristic of FIG. 2 for the particular power transistor 52 being utilized. As the power supply potential drops, the maximum collector current which may be switched increases. The limit current generator 60 may be implemented with linear approximation circuits utilizing a plurality of operational amplifiers or other implementations such as a lookup table with stored current values varying as a function of maximum collector to emitter voltage as illustrated in FIG. 2. The output signal $I_L$ varies in magnitude in response to the variation of the input potential to the limit current generator 60 varying on output terminal 56. A comparator 62 produces a TURNOFF SIGNAL in response to the current I sensed by sensor 64 which is flowing in the electrical load 66 being larger than the current $I_L$. The TURNOFF SIGNAL is applied as a first input to AND gate 64 which has a second input which is a switching signal for controlling the conductivity of the power transistor 52 to produce the output square applied to the filter. The output of the AND gate 64 provides a signal for turning on the transistor in response to the switching signal having a first predetermined level and a signal turning off the transistor in response to the TURNOFF SIGNAL or the switching signal having a second predetermined level. In accordance with the invention, operation within the safe operating area of the prior art as discussed above with respect to FIG. 2 is provided without a snubbing circuit or down sizing the snubbing circuit 10 to components while permitting maximum load current to be switched without damaging the junctions of the bipolar transistor consequent from switching inductive loads. The current limit varies dynamically as a function of the variation of the DC output potential of the three wave fullwave rectification bridge 54 while permitting maximum current I to be switched at the different operating potentials of the three phase fullwave rectification bridge 54.

While the invention has been described in terms of its preferred embodiment, it should be understood that numerous modifications may be made thereto without departing from the spirit and scope of the invention as defined in the appended claims. It is intended that all such modifications fall within the scope of the appended claims.

I claim:

1. A transistor circuit comprising:
   a bipolar transistor having a base and an emitter and collector coupled to a source of variable DC potential;
   an electrical load coupled between the source of variable DC potential and one of the emitter and collector;
   means, responsive to the variable DC potential, for producing a signal specifying a maximum current limit as a function of collector to emitter voltage during turning off which the transistor may switch without damage;
   a current sensor, coupled to the transistor circuit, for sensing current flow to the load from the source of DC potential; and
   a comparator, responsive to the current limit and the current flow to the load, for providing on an output a turnoff signal to the base of the transistor when the current flow exceeds the current limit.

2. A transistor circuit in accordance with claim 1 further comprising:
   a switching control signal source providing a switching signal to the base of the transistor for controlling conduction of the transistor, the turnoff signal being generated in response to the transistor being turned on by the switching signal and the current flow to the load exceeding the limit.

3. A transistor circuit in accordance with claim 2 further comprising:
   a base control gate having an output coupled to the base of the transistor and a pair of inputs respectively coupled to the output of the comparator and the switching signal, the gate providing a signal turning on the transistor in response to the switching signal having a first predetermined level and a signal turning off the transistor in response to either the turnoff signal or the switching signal having a second predetermined level.

4. A circuit in accordance with claim 3 wherein: the gate is an AND gate.

5. A transistor circuit in accordance with claim 1 wherein:
   the source of variable DC potential comprises a rectification bridge in a variable speed constant frequency power generating system in an airframe; and
   the transistor switch is within an inverter contained in the power generating system.

6. A transistor circuit in accordance with claim 2 wherein:
   the source of variable DC potential comprises a rectification bridge in a variable speed constant frequency power generating system in an airframe; and
   the transistor switch is within an inverter contained in the power generating system.

7. A transistor circuit in accordance with claim 3 wherein:
   the source of variable DC potential comprises a rectification bridge in a variable speed constant frequency power generating system in an airframe; and
   the transistor switch is within an inverter contained in the power generating system.

8. A transistor circuit in accordance with claim 4 wherein:
   the source of variable DC potential comprises a rectification bridge in a variable speed constant frequency power generating system in an airframe; and
   the transistor switch is within an inverter contained in the power generating system.

9. A transistor circuit in accordance with claim 5 further comprising:
   a snubbing circuit coupled to the emitter and collector of the transistor, the snubbing circuit containing a capacitor; and wherein
   the current limit is a maximum switchable collector current as a function of collector to emitter voltage during turnoff which the transistor may switch without damage; and
   the capacitance of the capacitor is a function of an amount of peak collection current which the transistor load may draw exceeds the maximum switchable collector current.

10. A transistor circuit in accordance with claim 6 further comprising:
    a snubbing circuit coupled to the emitter and collector of the transistor, the snubbing circuit containing a capacitor; and wherein
    the current limit is a maximum collector current as a function of collector to emitter voltage during turnoff which the transistor may switch without damage; and
    the capacitance of the capacitor is a function of an amount of peak collection current which the transistor load may draw exceeds the maximum switchable collector current.

11. A transistor circuit in accordance with claim 7 further comprising:
    a snubbing circuit coupled to the emitter and collector of the transistor, the snubbing circuit containing a capacitor; and wherein
    the current limit is a maximum collector current as a function of collector to emitter voltage during turnoff which the transistor may switch without damage; and
    the capacitance of the capacitor is a function of an amount of peak collection current which the transistor load may draw exceeds the maximum switchable collector current.

12. A transistor circuit in accordance with claim 8 further comprising:
    a snubbing circuit coupled to the emitter and collector of the transistor, the snubbing circuit containing a capacitor; and wherein
    the current limit is a maximum collector current as a function of collector to emitter voltage during turnoff which the transistor may switch without damage; and
    the capacitance of the capacitor is a function of an amount of peak collection current which the tranistor load may draw exceeds the maximum switchable collector current.

* * * * *